United States Patent
Lee et al.

(10) Patent No.: US 9,150,002 B2
(45) Date of Patent: *Oct. 6, 2015

(54) ELECTROLESS SURFACE TREATMENT PLATED LAYERS OF PRINTED CIRCUIT BOARD AND METHOD FOR PREPARING THE SAME

(75) Inventors: Dong Jun Lee, Gyeonggi-do (KR); Dong Ju Jeon, Seoul (KR); Jung Youn Pang, Gyeonggi-do (KR); Seong Min Cho, Gyeonggi-do (KR); Chi Seong Kim, Gyeonggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 125 days.

This patent is subject to a terminal disclaimer.

(21) Appl. No.: 13/532,063

(22) Filed: Jun. 25, 2012

(65) Prior Publication Data

US 2013/0003332 A1      Jan. 3, 2013

(30) Foreign Application Priority Data

Jun. 28, 2011    (KR) .................. 10-2011-0062940

(51) Int. Cl.
*B32B 15/10*       (2006.01)
*B32B 15/01*       (2006.01)
(Continued)

(52) U.S. Cl.
CPC ............... *B32B 15/018* (2013.01); *C22C 19/03* (2013.01); *C23C 18/1651* (2013.01); *C23C 18/32* (2013.01); *C23C 18/54* (2013.01); *H05K 3/244* (2013.01); *H05K 7/00* (2013.01); *H05K 1/0216* (2013.01); *H05K 1/09* (2013.01);
(Continued)

(58) Field of Classification Search
CPC .............. H01L 2924/3011; H01L 2924/01079; H01L 2924/01029; H01L 2924/01074; H01L 2924/01013
USPC ........... 428/216, 336, 672, 680, 699; 361/760
See application file for complete search history.

(56) References Cited

U.S. PATENT DOCUMENTS

| 4,483,711 A | 11/1984 | Harbulak et al. |
| 5,021,296 A | 6/1991 | Suzuki et al. |

(Continued)

FOREIGN PATENT DOCUMENTS

| JP | 61-41774 | 2/1986 |
| JP | 2007-31826 | 2/2007 |

(Continued)

OTHER PUBLICATIONS

Japanese Office Action issued Jul. 2, 2013 in corresponding Japanese Application No. 2012-142834.

(Continued)

*Primary Examiner* — Archene Turner
(74) *Attorney, Agent, or Firm* — NSIP Law

(57) ABSTRACT

An electroless surface treatment plated layer of a printed circuit board, a method for preparing the same, and printed circuit board including the same. The electroless surface treatment plated layer includes: electroless nickel (Ni) plated coating/palladium (Pd) plated coating/gold (Au) plated coating, wherein the electroless nickel, palladium, and gold plated coatings have thicknesses of 0.02 to 1 μm, 0.01 to 0.3 μm, and 0.01 to 0.5 μm, respectively. In the electroless surface treatment plated layer of the printed circuit board, a thickness of the nickel plated coating is specially minimized to 0.02 to 1 μm, thereby making it possible to form an optimized electroless Ni/Pd/Au surface treatment plated layer.

10 Claims, 3 Drawing Sheets

(51) Int. Cl.
*H05K 7/00* (2006.01)
*H05K 3/24* (2006.01)
*C22C 19/03* (2006.01)
*C23C 18/16* (2006.01)
*C23C 18/32* (2006.01)
*C23C 18/54* (2006.01)
*H05K 1/09* (2006.01)
*H05K 1/02* (2006.01)

(52) U.S. Cl.
CPC . *H05K2201/0338* (2013.01); *Y10T 428/12889* (2015.01)

(56) References Cited

U.S. PATENT DOCUMENTS

| | | | | |
|---|---|---|---|---|
| 5,438,223 | A * | 8/1995 | Higashi et al. | 257/774 |
| 6,028,011 | A * | 2/2000 | Takase et al. | 438/745 |
| 6,130,476 | A * | 10/2000 | LaFontaine et al. | 257/678 |
| 6,280,828 | B1 | 8/2001 | Nakatsuka et al. | |
| 6,570,251 | B1 * | 5/2003 | Akram et al. | 257/738 |
| 6,784,543 | B2 * | 8/2004 | Matsuki et al. | 257/746 |
| 6,974,776 | B2 * | 12/2005 | Dean et al. | 438/678 |
| 8,569,167 | B2 * | 10/2013 | Ghandi et al. | 438/640 |
| 8,742,554 | B2 * | 6/2014 | Shimazaki et al. | 257/676 |
| 2003/0019917 | A1 | 1/2003 | Furuno et al. | |
| 2004/0157080 | A1 | 8/2004 | Shinozaki | |
| 2008/0038476 | A1 | 2/2008 | Cordani | |
| 2008/0283282 | A1 | 11/2008 | Kawasaki et al. | |
| 2009/0039486 | A1 | 2/2009 | Shimazaki et al. | |
| 2009/0223816 | A1 | 9/2009 | Choi et al. | |
| 2010/0071940 | A1 | 3/2010 | Ejiri et al. | |
| 2011/0233761 | A1 * | 9/2011 | Hwang et al. | 257/737 |
| 2012/0248614 | A1 * | 10/2012 | Gandhi et al. | 257/762 |
| 2013/0260212 | A1 | 10/2013 | Kohno et al. | |

FOREIGN PATENT DOCUMENTS

| | | |
|---|---|---|
| JP | 2008-109087 | 5/2008 |
| JP | 2008-177261 | 7/2008 |
| JP | 2008-266668 | 11/2008 |
| KR | 10-2006-0006536 | 1/2006 |
| KR | 10-2006-0109365 | 10/2006 |
| KR | 10-2008-0093366 | 10/2008 |

OTHER PUBLICATIONS

Korean Notice of Allowance issued May 15, 2013 in corresponding Korean Application No. 10-2011-0062940.
Korean Office Action issued Jun. 18, 2012 in corresponding Korean Patent Application No. 10-2011-0062940.
U.S. Office Action mailed Apr. 10, 2014 in a possible related U.S. Appl. No. 13/472,299.

* cited by examiner

ELECTROLESS SURFACE TREATMENT PLATED LAYERS OF PRINTED CIRCUIT BOARD AND METHOD FOR PREPARING THE SAME

CROSS REFERENCE(S) TO RELATED APPLICATIONS

This application claims the benefit under 35 U.S.C. Section 119 of Korean Patent Application Serial No. 10-2011-0062940, entitled "Electroless Surface Treatment Plated Layers of Printed Circuit Board and Method for Preparing the Same" filed on Jun. 28, 2011, which is hereby incorporated by reference in its entirety into this application.

BACKGROUND OF THE INVENTION

1. Technical Field

The present invention relates to an electroless surface treatment plated layer of a printed circuit board, a method for preparing the same, and a printed circuit board including the same.

2. Description of the Related Art

In accordance with an increase in density of an electronic component, various technologies regarding surface treatment of a printed circuit board (PCB) have been developed. In accordance with the recent demand of PCB products that have been thinned and densified, a process of treating a surface of the PCB has been recently changed from electro Ni/Au surface treatment into electroless surface treatment in which tailless implementation may be easily performed in order to simplify a process and solve a problem such as noise, or the like.

Particularly, since the existing used electroless Ni/Au (hereinafter, referred to as ENIG) and recently prominent electroless Ni/Pd/Au (hereinafter, referred to as ENEPIG) have excellent solder connection reliability and wire bonding reliability, they have been used in various fields as well as a package substrate. However, in accordance with miniaturization of a wiring for increasing density of the electronic component, problems of a technology of surface-treating the circuit board according to the related art have started to emerge.

Meanwhile, as a scheme of connecting various devices such as a die, a main board, and the like, to each other, there are mainly two schemes, that is, a wire-bonding scheme and a solder joint scheme.

FIGS. 1A and 1B are, respectively, a cross-sectional view and a top view when a plated layer and a device are connected to each other using the wire-bonding scheme according to the related art. Referring to FIGS. 1A and 1B, a polymer resin layer 20 is first formed at a portion except for a copper layer 10 in a printed circuit board to thereby subsequently serve as a resist to plating, and electroless Ni layer 31/Pd layer 32/Au layer 33 are formed as a plated layer 30 using an electroless plating method in order to protect the copper layer 10. In addition, after the electroless Ni/Pd/Au surface treatment plated layer 30 is formed, the metal layers are interconnected using a gold (Au) wire, or the like.

In a substrate including the plated layer 30 of the ENIG or ENEPIG, in the case of the ENIG, the Ni layer has a thickness of at least 3 μm and the Au layer has a thickness of 0.05 to 0.5 μm, and in the case of the ENEPIG, the Ni layer has a thickness of at least 3 μm, the Pd layer has a thickness of 0.05 to 0.3 μm, and the Au layer has a thickness of 0.05 to 0.5 μmm, as seen in FIG. 2.

That is, the Ni layer generally has the thickest thickness of 3 μm or more, more specifically, 3 to 7 μm. The reason is that the electroless Ni layer needs to have coating performance without a defect in order to serve as a barrier layer to thereby suppress diffusion of underlying copper.

However, when the thickness of the Ni layer is thick, as a frequency increases, a phenomenon in which a current flows in a surface due to a skin effect, such that it is concentrated on an outermost layer of Ni/Au or Ni/Pd/Au rather than an inner layer of Cu wiring occurs. However, the Ni layer has electrical resistance higher than that of Cu, such that electrical characteristics are deteriorated. Therefore, a solution thereof has been demanded.

Further, in the case in which the layers have the above-mentioned thicknesses, it is impossible to reduce a space between patterns to 25 μm or less, which is an object of the next generation technology. The reason is that when the space between the patterns becomes narrow, the Ni layer abnormally grows between the patterns to thereby cause an electrical bridge.

SUMMARY OF THE INVENTION

An object of the present invention is to provide an electroless surface treatment plated layer of a printed circuit board capable of solving a non-uniformity problem of current flow caused by a skin effect by solving several problems generated due to a thick thickness of a nickel layer included in a plated layer in connecting the surface treatment plated layer and external devices to each other using a wire bonding scheme.

Another object of the present invention is to provide a method for forming an electroless surface treatment plated layer of a printed circuit board in which a plated layer is formed on a surface of a copper layer in order to protect the copper layer.

Another object of the present invention is to provide a printed circuit board including an electroless surface treatment plated layer.

According to an exemplary embodiment of the present invention, there is provided an electroless surface treatment plated layer of a printed circuit board, the electroless surface treatment plated layer including: electroless nickel (Ni) plated coating/palladium (Pd) plated coating/gold (Au) plated coating, wherein the electroless nickel, palladium, and gold plated coatings have thicknesses of 0.02 to 1 μm, 0.01 to 0.3 μm, and 0.01 to 0.5 μm, respectively.

The electroless surface treatment plated layer may be connected to external devices in a wire bonding scheme.

8 wt % or more of phosphorus (P) may be contained in the electroless nickel plated coating.

The phosphorus (P) may be to prevent oxidation of the electroless nickel plated coating.

According to another exemplary embodiment of the present invention, there is provided a printed circuit board including the electroless surface treatment plated layer as described above.

As a frequency band increases, due to a skin effect phenomenon in which a current flows along a conductor surface, the current flows in a nickel layer having high electrical specific resistance at the time of use of an existing ENEPIG layer, such that an electrical resistance value increases. However, in the case of the printed circuit board according to the present invention including the electroless surface treatment plated layer as described above, a thickness of a nickel plated layer in the electroless surface treatment plated layer is significantly reduced to alleviate an increase in electrical resistance value in a high frequency band, thereby making it possible to improve an electrical signal.

Plated layers formed as the electroless surface treatment plated layer of the printed circuit board may have a space of 25 μm or less therebetween.

According to another exemplary embodiment of the present invention, there is provided a method for forming an electroless plated layer of a printed circuit board, the method including: forming an electroless surface treatment plated layer by sequentially forming nickel (Ni) plated coating/palladium (Pd) plated coating/gold (Au) plated coating, the electroless nickel, palladium, and gold plated coatings have thicknesses of 0.02 to 1 μm, 0.01 to 0.3 μm, and 0.01 to 0.5 μm, respectively.

8 wt % or more of phosphorus (P) may be contained in the electroless nickel plated coating.

A phosphorus content in the electroless nickel plated coating may be adjusted to the above-mentioned by relatively lowering a pH of a Ni plating solution at the time of electroless nickel plating. That is, although a pH adjustment range may be slightly different according to a commonly used electroless nickel plating solution, in the case of the widely used NPR 4 agent available from Uyemora & Co., Ltd, the pH is managed to be 4.5 or less or concentration of a sulfur compound additive is appropriately lowered, thereby making it possible to adjust the pH to be in the above-mentioned range.

A phosphorus content in the electroless nickel plated coating may be adjusted by adding an organic compound additive to a nickel plating solution.

The electroless gold plated coating may be formed in a substitution/reduction type or a substitution type.

DESCRIPTION OF THE PREFERRED EMBODIMENTS

Hereinafter, the present invention will be described in more detail.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

The present invention relates to an electroless surface treatment plated layer of a printed circuit board including nickel (Ni) plated coating/palladium (Pd) plated coating/gold (Au) plated coating formed on a connection terminal in an electroless plating scheme, wherein the electroless nickel, palladium, and gold plated coatings have thicknesses of 0.02 to 1 μm, 0.01 to 0.3 μm, and 0.01 to 0.5 μm, respectively.

Figure 3:
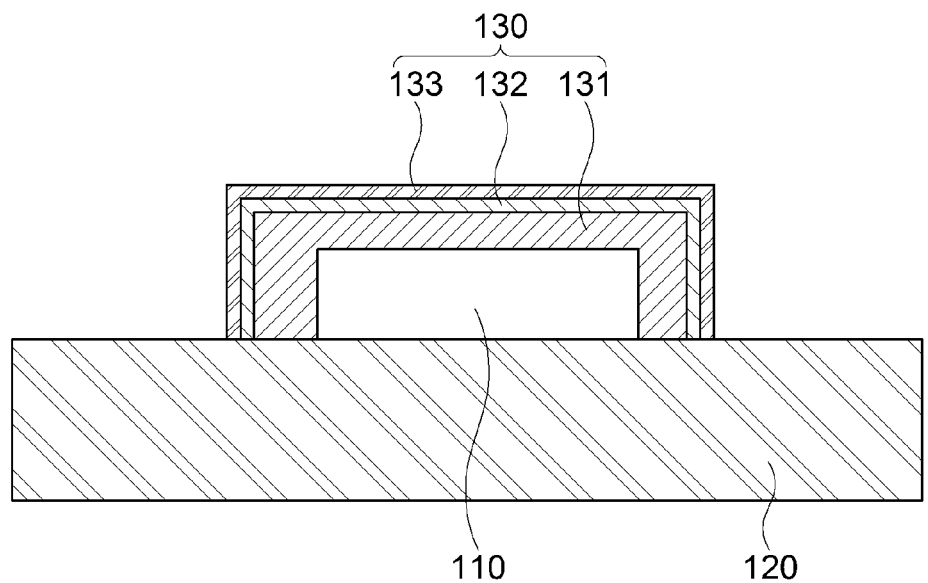
FIG. 3 is a view showing a structure of electroless Ni/Pd/Au surface treatment metal layer according to an exemplary embodiment of the present invention.

FIG. 3 shows a structure of electroless Ni/Pd/Au surface treatment plated layer of a printed circuit board according to an exemplary embodiment of the present invention. Referring to FIG. 3, a polymer resin layer 120 is formed at a portion except for a copper layer 110 in a printed circuit board to thereby subsequently serve as a resist to plating, and electroless Ni plated coating 131/Pd plated coating 132/Au plated coating 133 are formed as a plated layer 130 using an electroless plating method in order to protect the copper layer 110.

According to the exemplary embodiment of the present invention, in order to overcome a disadvantage of the scheme according to the related art, a thickness of the nickel plated coating 131 is reduced, thereby making it possible to maximally suppress an increase in resistance generated at the time of an increase in frequency, which is a problem according to the related art.

The nickel plated coating 131 of the electroless surface treatment plated layer according to the exemplary embodiment of the present invention may have a thickness of 0.02 to 1 μnm. When the nickel plated coating has a thickness exceeding 1 μm, a Ni layer having high electrical resistance has a relatively thick thickness, such that an improvement effect of electrical characteristics is low in a high frequency band. In addition, when the nickel plated coating has a thickness less than 0.02 μm, a problem such as deterioration of corrosion resistance, or the like, is generated.

After the electroless nickel plated coating 131 is formed, the electroless palladium (Pd) plated coating 132 is plated on the nickel plated coating. The electroless Pd plated coating 132 serves to suppress a phenomenon in which an electrochemically active Ni layer is reacted and corroded with Au at the time of immersion Au or electroless Au plating. The electrode palladium plated coating according to the exemplary embodiment of the present invention may have a thickness of 0.01 to 0.3 μm. When the electroless palladium (Pd) plated coating has a thickness exceeding 0.3 μm, the cost increases.

Finally, in the electroless surface treatment plated layer, after the electroless palladium plated coating 132 is formed, the electroless gold (Au) plated coating 133 is plated on the electroless palladium plated coating. The electroless Au plated coating 133 serves to prevent oxidation to thereby maintain wire bonding characteristics. The electroless gold plated coating according to the exemplary embodiment of the present invention may have a thickness of 0.01 to 0.5 μm. When the electroless Au plated coating has a thickness exceeding 0.5 μm, the cost increases.

The electroless Ni/Pd/Au surface treatment plated layer 130 formed as described above may be connected to external devices in a wire bonding scheme using a gold (Au) wire.

In addition, 8 wt % or more of phosphorus, and preferably, 9 to 11 wt % of phosphorus is contained in the electroless nickel plated coating 131. The phosphorus is to prevent oxidation of the electroless nickel plated coating. When relatively high wt % of phosphorus is contained in the electroless nickel plated coating, the oxidation of the electroless nickel plated coating may be effectively prevented.

According to an exemplary embodiment of the present invention, a printed circuit board including the electroless surface treatment plated layer may be provided.

In the case of the printed circuit board including the electroless surface treatment plated layer according to the exemplary embodiment of the present invention, even though a frequency band increases, an electrical resistance value of the electroless surface treatment plated layer does not increase. The thickness of the nickel layer forming the electroless surface treatment plated layer is minimized, thereby making it possible to basically solve a problem in which even through the frequency band increases, a current flows in the surface treatment plated layer. Therefore, a problem in which the flow of the current is concentrated only on the surface layer caused by the skin effect in the related art is solved, thereby making it possible to allow the current to uniformly flow.

Further, in the printed circuit board according to the exemplary embodiment of the present invention, plated layers formed as the electroless surface treatment plated layer may have a space of 25 μm or less therebetween.

A method for forming an electroless surface treatment plated layer of a printed circuit board according to an exemplary embodiment of the present invention will be described. The method for forming an electroless surface treatment plated layer of a printed circuit board includes forming an electroless surface treatment plated layer by sequentially forming nickel (Ni) plated coating/palladium (Pd) plated coating/gold (Au) plated coating, wherein the electroless nickel, palladium, and gold plated coatings have thicknesses of 0.02 to 1 μm, 0.01 to 0.3 μm, and 0.01 to 0.5 μm, respectively.

Nickel, palladium, and gold plating solutions configuring the electroless surface treatment plated layer according to the exemplary embodiment of the present invention is not specifically limited but may be any solution generally used in the art. In addition, a specific plating method is also not specifically limited but conforms to a general level.

However, the electroless surface treatment plated layer according to the exemplary embodiment of the present invention needs to be plated so that the electroless nickel, palladium, and gold plated coatings have thicknesses of 0.02 to 1 μm, 0.01 to 0.3 μm, and 0.01 to 0.5 μm, respectively.

Particularly, as the nickel plating solution, hypophosphite is generally used, and phosphorus is contained in a precipitated coating. The phosphorus (P) may effectively serve to prevent the oxidation of the Ni plated coating. Therefore, 8 wt % or more of phosphorus (P), and preferably, 9 to 11 wt % of phosphorus (P) is contained in the electroless nickel plated coating 131 according to the exemplary embodiment of the present invention.

Two methods may be used in order to allow the electroless nickel plated coating according to the exemplary embodiment of the present invention to contain the above-mentioned phosphorus content. One method is a method of lowering a pH of the electroless nickel plating solution. In the case of the widely used NPR-4 agent available from Uyemora & Co., Ltd, a nickel plating solution has a pH of 4.5 to 4.7. However, in the case of the present invention, the pH of the nickel plated coated is reduced to 4.2 to 4.4 to thereby maintain a phosphorus content at a relatively high level.

The other method is a method of reducing a content of a sulfur compound additive added to the electroless nickel plating solution to thereby control a phosphorus content in the electroless nickel plated coating to be in the above-mentioned range. That is, the content, or the like, of the sulfur compound such as Thio Urea is lowered, thereby making it possible to allow the electroless nickel plated coating to have a desired level of phosphorus content.

According to the exemplary embodiment of the present invention, the electroless gold plated coating may be formed in a substitution/reduction type. In addition, a substitution type of immersion gold plated coating layer may be formed. When the electroless gold plated coating is formed in a general substitution type, a corrosion hole is formed in densely formed electroless Ni and Pd plated coatings to thereby deteriorate the ability to prevent the diffusion of the copper. However, when the electroless gold plated coating is formed in the substitution/reduction type, a substitution reaction is directly performed in an early stage of a reaction. Therefore, the Ni and Pd plated coatings are not attacked, thereby making it possible to obtain a plated layer having a dense structure. However, a substitution type of Au, which may be easily managed and is inexpensive, may also be used.

Hereinafter, an example of the present invention will be described in detail with reference to the accompanying drawings. However, this example is only to illustrate the present invention and is not to be construed as limiting a scope of the present invention.

EXAMPLE 1

1) Electroless Ni Plating

A substrate subjected to pretreatment was immersed in an electroless Ni plating solution (pH: 4.2 to 4.4, NPR-4: a product available from Uyemora & Co., Ltd) allowing 10 wt % of phosphorus to be contained in a plated coating at a temperature of 65° C. for 1 minute and then cleaned for 2 minutes to thereby obtain an electroless nickel plated coating having a thickness of 0.1 μm.

2) Electroless Pd Plating

The substrate subjected to the electroless Ni plating was immersed in XTP (pH: 7.2, a product available from Uyemora & Co., Ltd), which is an electroless Pd plating solution, at a temperature of 50° C. for 10 minutes and then cleaned for 2 minutes to thereby obtain an electroless palladium plated coating having a thickness of 0.1 μm.

3) Electroless Au Plating

The substrate subjected to the electroless Ni plating and the electroless Pd plating was immersed in an electroless gold plating solution (GoBright TSB-72, a product available from Uyemora & Co., Ltd) at a temperature of 80° C. for 5 minutes, cleaned for 2 minutes, and then dried at a temperature of 150° C. for 5 minutes by a ventilation drier to thereby obtain electroless nickel/palladium/gold plated layer in which an electroless gold plated coating having a thickness of 0.1 μm is formed.

4) Wire Bonding

The electroless nickel/palladium/gold surface treatment plated layer and external devices were connected to each other by a gold wire.

COMPARATIVE EXAMPLE 1

Electroless nickel/palladium/gold plated layer was obtained through the same process as that of Example 1 except that an electroless nickel plated coating having a thickness of 5 μm is formed.

EXPERIMENTAL EXAMPLE

Cross-sectional photographs of the electroless nickel/palladium/gold plated layers obtained according to Example and Comparative Example were observed by a scanning electron microscope (SEM). Results of the observation were shown in FIGS. 2 and 4.

Figure 1A:
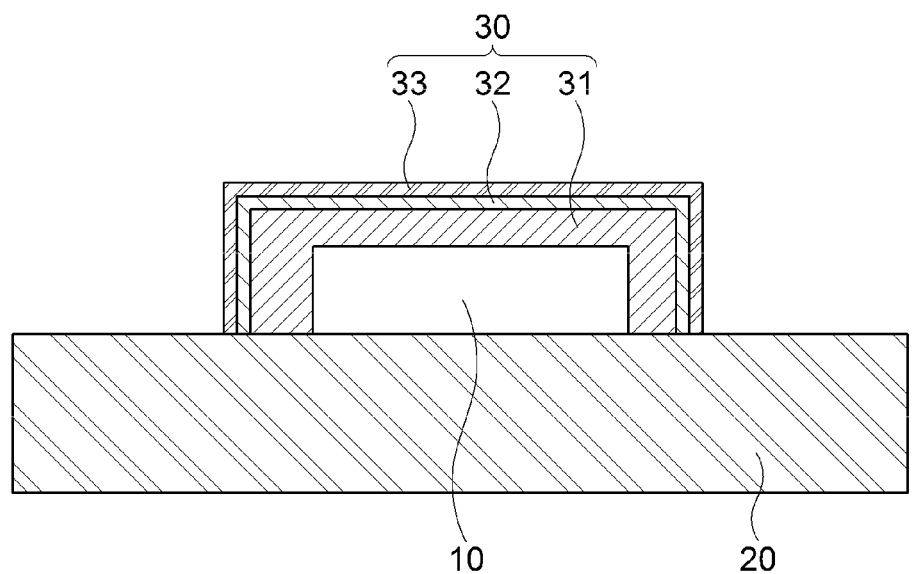
FIGS. 1A and 1B are, respectively, a cross-sectional view and a top view when a plated layer and a device are connected to each other using the wire-bonding scheme according to the related art.
Figure 1B:
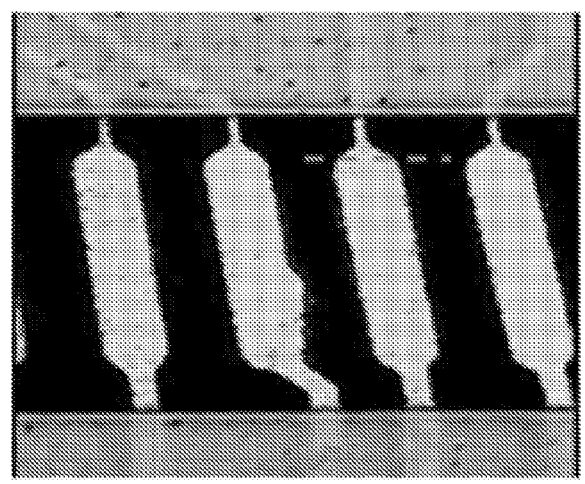
Figure 2:
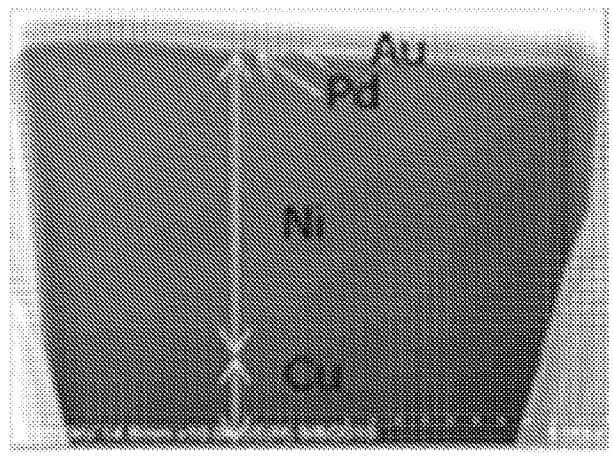
FIG. 2 is a scanning electron microscope (SEM) photograph of electroless Ni/Pd/Au surface treatment metal layer formed on a Cu layer according to the related art.

Referring to FIG. 2, in the case of the nickel/palladium/gold plated layer according to the related art, it may be appreciated that the nickel plated coating has a significant thick thickness. In this case, a current flows in the nickel layer of the plated layer while mainly flowing along a surface in a high frequency band, thereby causing a problem that electrical resistance increases due to a skin effect in which the current mainly flows in the nickel layer rather than an inner layer of copper wiring.

Figure 4:
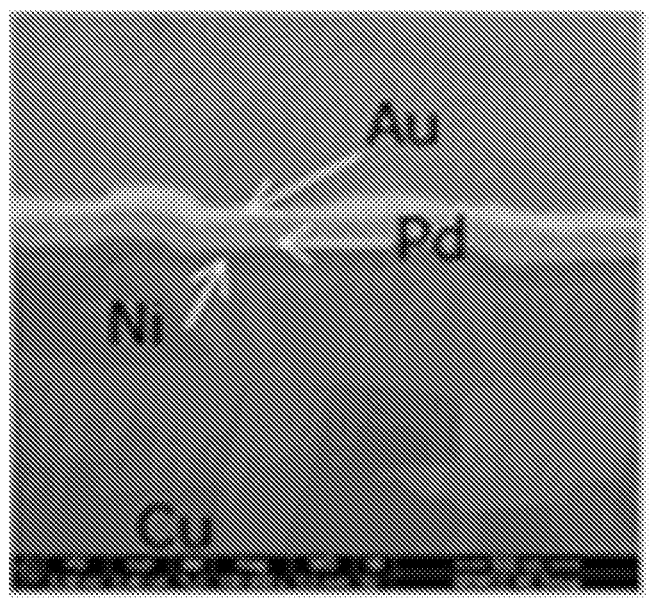
FIG. 4 is a SEM photograph of electroless Ni/Pd/Au surface treatment metal layer formed on a Cu layer according to an exemplary embodiment of the present invention.

However, referring to FIG. 4 showing a cross-sectional photograph of the electroless nickel/palladium/gold surface treatment plated layer prepared according to the exemplary embodiment of the present invention, it may be appreciated that the nickel plated coating has a thickness almost similar to those of the palladium and gold plated coatings. Therefore, it is possible to solve the problem that the electrical resistance increases in the high frequency band due to a thick thickness of the nickel plated coating according to the related art. Therefore, it is possible to improve electrical characteristics of the printed circuit board including the electroless nickel/palladium/gold surface treatment plated layer.

With the electroless surface treatment plated layer of the printed circuit board according to the exemplary embodiment of the present invention, the thickness of the nickel plated coating is specially minimized to 0.02 to 1 μm, thereby making it possible to form an optimized electroless Ni/Pd/Au surface treatment plated layer.

In addition, with the electroless surface treatment plated layer of the printed circuit board according to the exemplary embodiment of the present invention, the thickness of the nickel coating is significantly reduced, thereby making it possible to reduce a phenomenon in which a current flows in the nickel layer having high electrical resistance caused by the skin effect phenomenon in which the current flows along a surface in a high frequency band when the electroless surface treatment plated layer is connected to the external devices in the wire bonding scheme, such that the electrical resistance increases and the electrical signal characteristics are deteriorated. That is, the thickness of the nickel coating is significantly reduced to allow a more current to flow in the Cu layer having low electrical specific resistance in the high frequency band, thereby making it possible to improve the electrical characteristics.

In addition, with the electroless surface treatment plated layer of the printed circuit board according to the exemplary embodiment of the present invention, the nickel coating has a thin thickness, thereby making it possible to suppress generation of an electrical bridge due to undesired abnormal Ni plating generation between pattern spaces at the time of the electroless nickel plating on the copper plated layer having a pattern space of 25 μm or less.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. An electroless surface treatment plated layer of a printed circuit board, the electroless surface treatment plated layer comprising:
   nickel (Ni) plated coating/palladium (Pd) plated coating/gold (Au) plated coating,
   wherein the electroless nickel, palladium, and gold plated coatings have thicknesses of 0.02 to 1 μm, 0.01 to 0.3 μm, and 0.01 to 0.5 μm, respectively.

2. The electroless surface treatment plated layer according to claim 1, wherein the electroless surface treatment plated layer is connected to external devices in a wire bonding scheme.

3. The electroless surface treatment plated layer according to claim 1, wherein 8 wt% or more of phosphorus (P) is contained in the electroless nickel plated coating.

4. The electroless surface treatment plated layer according to claim 3, wherein the phosphorus (P) is to prevent oxidation of the electroless nickel plated coating.

5. A printed circuit board comprising the electroless surface treatment plated layer according to claim 1.

6. The printed circuit board according to claim 5, wherein when a frequency band increases, an electrical resistance value of the electroless surface treatment plated layer does not increase.

7. The printed circuit board according to claim 5, wherein the electroless surface treatment plated layer is disposed as plural stacks of plated layers, each stack formed on a respective conductive member, arranged with a distance of 25 μm or less between two of the stacks of the plated layers.

8. A printed circuit board comprising:
   a conductive member in contact with an insulating layer of the printed circuit board; and
   the electroless surface treatment plated layer according to claim 1, plated on the conductive member.

9. The electroless surface treatment plated layer according to claim 1, wherein the thickness of the nickel coating is about 0.1 μm or less.

10. A printed circuit board comprising the electroless surface treatment plated layer according to claim 9 plated on a conductive pattern, the electroless surface treatment plated layer connected to an external device in a wire bonding scheme.

* * * * *